United States Patent [19]

Alvis et al.

[11] Patent Number: 4,704,367
[45] Date of Patent: Nov. 3, 1987

[54] SUPPRESSION OF HILLOCK GROWTH THROUGH MULTIPLE THERMAL CYCLES BY ARGON IMPLANTATION

[76] Inventors: John R. Alvis, 11708 Barchetta, Austin, Tex. 78758; Orin W. Holland, 13202 Adonis Dr., Austin, Tex. 78729

[21] Appl. No.: 853,840

[22] Filed: Apr. 21, 1986

[51] Int. Cl.$^4$ ......................................... H01L 21/265
[52] U.S. Cl. ......................................... 437/24; 437/14; 437/196; 437/247; 357/67; 148/DIG. 140
[58] Field of Search .................... 29/576 B, 590, 591; 148/1.5, 187; 357/67

[56] References Cited

U.S. PATENT DOCUMENTS 4,520,554 6/1985 Fisher ................................... 29/591
4,536,223 8/1985 Faith, Jr. ............................. 148/1.5

OTHER PUBLICATIONS

Ashok et al., Thin Solid Films 126 (1985) 251.
Cadien et al., J. Vac. Sci. Technol. B-2 (1984) 82.
Hikosaka et al. Rad. Effects, 51 (1980) 253.
Whitlow et al., J. Appl. Phys. 58 (1985) 3246.
Y. Kamei et al., "Ion Implanted Double Level Metal Process," *IEDM Technical Digest*, (1984), pp. 138–141.

*Primary Examiner*—Upendra Roy
*Attorney, Agent, or Firm*—John A. Fisher; Jeffrey Van Myers; David L. Mossman

[57] ABSTRACT

A technique for suppressing hillock growth in metal films on integrated circuits through multiple thermal cycles by argon implantation. Although it was known that ion implantation of many species such as arsenic suppressed the growth of hillocks in metal films through one thermal cycle, it was discovered that only one of the proposed ions, argon, would suppress hillock formation for multiple subsequent thermal cycles. For the other species, hillock formation would reoccur after multiple cycles. This characteristic is important for double layer metal (DLM) processes to prevent interlayer shorting.

10 Claims, 7 Drawing Figures

SUPPRESSION OF HILLOCK GROWTH THROUGH MULTIPLE THERMAL CYCLES BY ARGON IMPLANTATION

FIELD OF THE INVENTION

The invention relates to the use of metal layers and films in the fabrication of integrated circuits, and more particularly relates to techniques for the suppression of hillocks that form in integrated circuit metal films during subsequent thermal cycles or steps.

BACKGROUND OF THE INVENTION

Metals are used in integrated circuits for interconnects and ohmic contacts, and aluminum and aluminum alloys remain the metals of choice in very large scale integration (VLSI) fabrications because of their low resistivity and compatibility with other processes. However, both pure and alloyed aluminum are susceptible to hillock formation as a result of stress induced by thermal processing. Hillocks are accumulations or buildups of metal in the film. This phenomenon is particularly troublesome in double-layer metallization (DLM) schemes where hillocks in the first layer can lead to interlayer shorting with the second, subsequent layer. It is widely accepted that strain in compressively stressed thin films is relieved by extrusion of the metal at the surface into columnar cells referred to as hillocks. Hillocks greater than one micron (um) in height have been observed. This stress is generated in aluminum thin films as a result of the mismatch of the thermal expansion coefficients between the metal and the underlying layer. Recently, it has been reported by Y. Kamei, et al. in "Ion Implanted Double Level Metal Process," *IEDM Technical Digest*, p. 138 (1984) that ion implantation of the metal significantly retards the growth of hillocks. This suppression of hillock growth was attributed to surface disordering resulting from ion-induced radiation damage and not to chemical differences between the metal and implanted species. To eliminate the possibility of chemical effects, Kamei, et al. implanted inert argon ($Ar^+$) ions which was shown to be equally effective in suppressing hillocks.

However, the applicants found in further investigations into hillock suppression in aluminum metal by ion implantation that in almost all cases, the suppression of hillock growth during subsequent thermal cycles, a thermal or anneal cycle being the point of hillock growth, lasts only through one thermal cycle and is not effective for the suppression of hillock growth during a second and subsequent thermal cycles. Since DLM processes require multiple thermal cycles after the patterning of the first metal film, the ion implantation hillock suppression technique discovered by Kamei, et al. is of limited usefulness. It would be desirable for there to be a hillock suppression technique that would be effective for multiple thermal cycles.

SUMMARY OF THE INVENTION

Accordingly, it is an object of the present invention to provide a process in the fabrication of integrated circuits for suppressing the growth of hillocks in a metal film for multiple subsequent thermal cycles.

Another object of the invention is to provide a hillock growth suppression technique that would be useful in DLM processes.

It is yet another object of the present invention to provide a process for suppressing the growth of hillocks in aluminum and aluminum alloy films for multiple subsequent thermal cycles.

In carrying out these and other objects of the invention, there is provided in the manufacture of an integrated circuit on a semiconductor substrate, in one form, a process for suppressing the growth of hillocks in a metal film for multiple thermal cycles that involves distributing argon ions into selected regions of the metal film. Processing the metal film through subsequent integrated circuit fabrication steps involving two or more thermal cycles does not result in an increase in the incidence of hillock formation.

DETAILED DESCRIPTION OF THE INVENTION

As noted, the applicants have conducted further investigations into hillock suppression in metal films by ion implantation. It was discovered that the resistance of implanted metal to deformation under compressive stress is not solely related to damage and/or defects during implantation as suspected by Y. Kamei, et al. Rather, the behavior of the impurity within the metal film, which is species specific, appears to play a key role in determining the properties of the implanted thin film. The influence of different implanted ions, $As^+$, $O^+$, $Ar^+$ and $Al^+$ (the self-ion) on hillock growth were investigated in support of these conclusions. The applicants surprisingly discovered that none of the ions would suppress hillock growth in metal films for multiple thermal cycles, except for argon. Y. Kamei, et al. showed a variety of ions to be effective in reducing hillock growth, including $H^+$, $B^+$, $P^+$, $Ar^+$, $BF_2^+$, and $As^+$. Most of their data was for the $As^+$ ion. However, the applicants herein did not find arsenic, or the other ions investigated, to be an effective hillock growth suppression agent beyond one thermal cycle. The dependency of various film properties on the dose of implanted $Ar^+$ ions was also investigated.

Experimental Procedure

Depositions were done on a Varian 3190 sputter coater with the substrate heated to 150° C. Alloy films of Al/1% Si/1% Cu (800+50 nm thick) were deposited on unpatterned, silicon wafers which had 1 μm of thermally grown oxide thereon. Grains in the as-deposited metal films were <1 um in diameter. The films were implanted after deposition with a current density of <40 microamp/cm². The films were then furnace annealed at 450° C. in forming gas, 5% $H_2$ in $N_2$.

The topography of the film was measured using a Dektak profilometer which utilized a 12.5 um radius stylus drawn across the surface of the wafer. Also, optical and scanning electron microscopy (SEM) were used to characterize the texture of the surface.

Film stress analysis was done using an Ionic wafer deflection gauge. A measurement of the gap between the probe head and the wafer is used to determine the bowing of the wafer as a result of the coating.

Results

Figure 1:
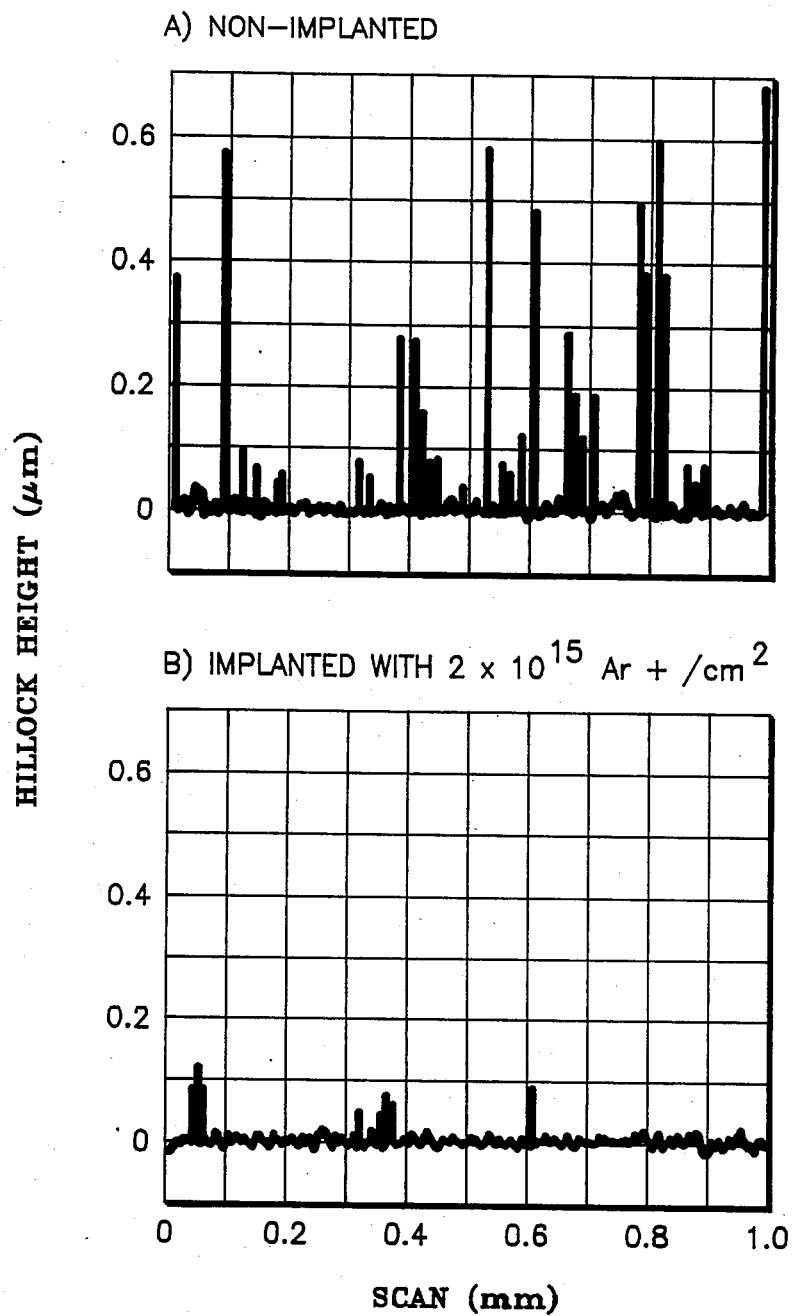
FIGS. 1A, 1B is a comparison of two graphs of the surface topography of implanted and non-implanted metal after two thermal cycles.

A comparison of surface topography of implanted and non-implanted metal after two thermal cycles at 450° C. and 60 minutes is made in FIG. 1. FIG. 1A is a chart of the surface topography of the non-implanted film, and FIG. 1B is a chart of the surface topography of a film implanted with $2 \times 10^{15}$ Ar+/cm² at 50 KeV. It is clear that the size of the hillocks in the argon implanted metal is significantly less than in the metal without implantation. This is similar to the results reported by Y. Kamei, et al. Hillock growth was observed in the standard metal after each thermal cycle while little or no growth occurred in the implanted film. Ar+ implanted films have been thermally cycled five times and no growth of hillocks occurred. Different anneal times (i.e. 30, 60, 90 minutes) produced little or no variation in hillock size or density in either film.

The behavior of the implanted metal was found to be dependent on the implant species. Arsenic implantation ($10^{16}$cm⁻², 50 KeV) was found to suppress hillock formation only during the initial anneal (thermal cycle). Prolific growth occurred in the implanted film during subsequent thermal cycles such that the hillock size and density was comparable to that of a standard, non-treated metal. Contrasting this behavior, surface profilometry showed that O+ implantation at $10^{16}$cm⁻² and 50 KeV did not affect hillock growth during an initial anneal at 450° C. and 60 minutes, but stabilized the film so that no further growth occurred during a second thermal cycle.

These results clearly demonstrate a species-dependent behavior of the implanted metal. Since the damage energy deposited by the different ions in the Al film are similar, implant damage alone cannot account for this effect. This was further established by the results of Al+ (self-ion) implantation. Al+ implantation unambiguously removes any chemical influences in the metal film due to implant species. No differences were observed between the Al+ implanted and standard metal film without treatment after either a single or double thermal cycle at 450° and 60 minutes. Self-ion implantation produced no observable change in the metal's propensity to form hillocks and therefore eliminates the possibility that implantation damage is solely responsible for the observed effects.

While surface profilometry using a mechanical stylus clearly showed that hillocks are reduced as a result of Ar+ implantation, it is difficult to quantify the results so that a dose dependency could be determined. Alternatively, hillocks are clearly visible using an optical microscope. In dark field micrographs, the hillocks may be seen as bright circular regions.

Figure 2:
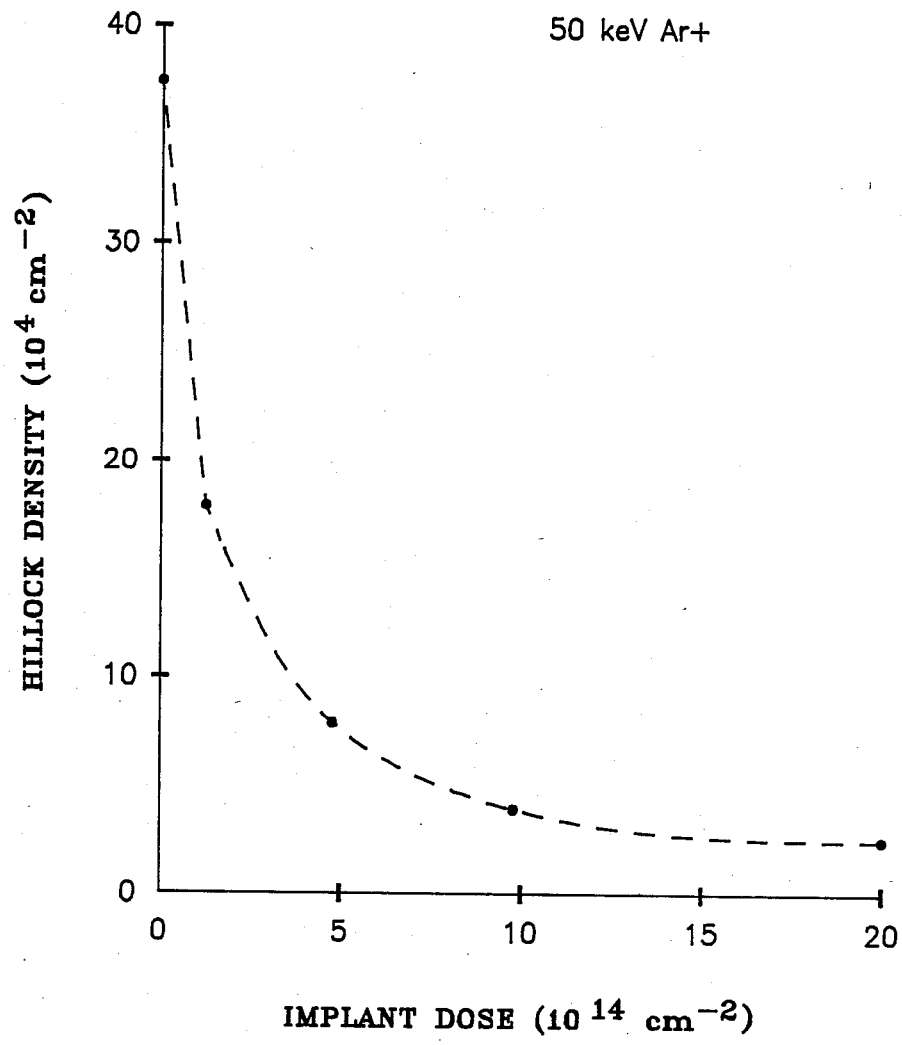
FIG. 2 is a graph of the density of hillocks in a metal film as a function of the dose of the ion implantation.

The density of large hillocks in the implanted film is small, similar to the Dektak results noted above. The density of hillocks having >1.5 um diameter in films implanted with Ar+ ions at 50 KeV determined from microphotographs is shown in FIG. 2 to decrease nearly exponentially with dose. However, this rapid decrease in the density of large hillocks is compensated by an equally rapid increase in the density of small hillocks. This is consistent with stress measurements in the thin films which showed that strain relief during thermal cycling in both implanted and non-implanted films resulted in a nearly identical film stress. Apparently, stress is relieved in the implanted film by the formation of hillocks as in the non-implanted case. However, the hillocks formed in the implanted metal are more numerous but with greatly reduced height. Such a characteristic would be useful in a DLM process where taller hillocks would cause interlayer shorting whereas the smaller hillocks would not.

While Ar+ ion-implanted metal was found to be resistant to the formation of large hillocks even after repeated thermal cycling, large holes or voids of >1um in diameter were found in the films of high implantation doses. Voids in a metal film implanted with $5 \times 10^{15}$ Ar+/cm² may be seen as pits or spots in a SEM micrograph. These voids are not visible after implantation and apparently form during annealing. Cross-sectional SEM micrographs and energy dispersive X-ray spectrometry (EDX) confirmed that the voids extended through the entire film thickness. The size and density of the voids decreased rapidly with decreasing implant dose. At a dose of $1 \times 10^{15}$cm⁻², no evidence of voiding within the metal film could be detected. An argon implantation dose of between about 0.5 and $2 \times 10^{15}$ cm⁻² would insure multiple anneal hillock suppression without serious void damage, while a narrower range between about 1 and $2 \times 10^{15}$ cm⁻² may be seen as an optimal range compromising between hillock growth suppression and void minimization.

The resistivity of the ion-implanted film increases by about 10% after implantation but recovers to its original value of 3.0 micro-ohm-cm after alloy. The reflectivity of the film decreases after implant by about 5% which reflects the microstructural changes of the film. After alloy, both implanted and non-implanted metal films have similarly reduced reflectivity.

The microstructure of aluminum alloy film can thus be significantly affected by implantation over the penetration depth of the ions. This can occur as a result of ion-induced damage and/or the formation of a second phase or alloy due to the implanted impurity. Additionally, solute segregation and second phase formation are known to affect the kinetics of dislocation reactions and grain growth. A greatly reduced grain size was observed in the Ar+ implanted films by the applicants after annealing. While this clearly indicates that the damaged near-surface region (0.1 um at 50 KeV) can restrict grain growth, the exact mechanism of hillock reduction or its dependency on implant species are not well understood.

The advantages of the inventive process of hillock suppression through argon distribution may be schematically illustrated in FIGS. 3 and 4. It will be understood that the features illustrated in the cross-sections shown are exaggerated in the vertical dimension for clarity, and the proportions may not exactly reflect a real situation, nevertheless, the problem illustrated and cured is accurately depicted.

Figure 3A:
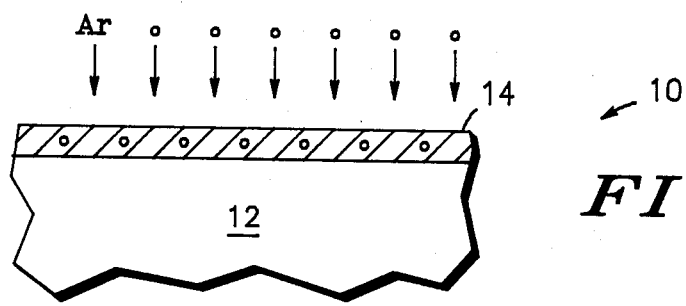
FIGS. 3A, 3B is a schematic cross-section illustration showing the critical step of the present invention of implantation with argon and the results therefrom after multiple thermal cycles.
Figure 3B:
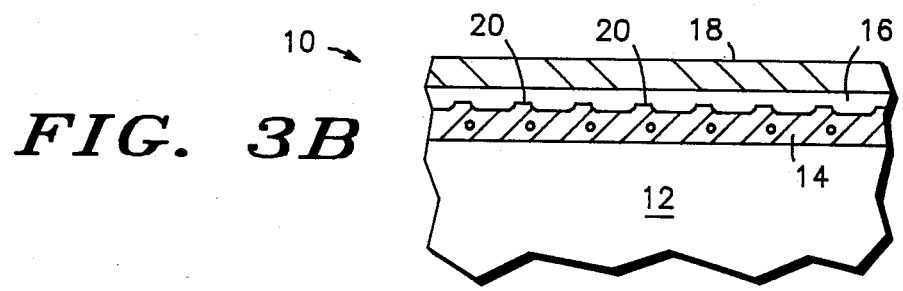

FIG. 3A illustrates a cross-section of an integrated circuit 10 under construction, shown only partially. Semiconductor substrate 12, which may already have devices, films and layers formed thereon but which are not shown, has formed thereon a metal film 14 which is having argon atoms distributed therein, as represented by the circles. This distribution of argon atoms is in accordance with the inventive process and may be accomplished by ion implantation. As shown in FIG. 3B, which schematically represents a DLM process, dielectric layer 16 is formed over metal film 14 and a subsequent metal film 18 is formed over dielectric layer 16. Typically by this stage, the integrated circuit 10 has been through multiple thermal cycles subsequent to the argon implantation of FIG. 3A, which has caused only the formation of many small or tiny hillocks 20.

Figure 4A:
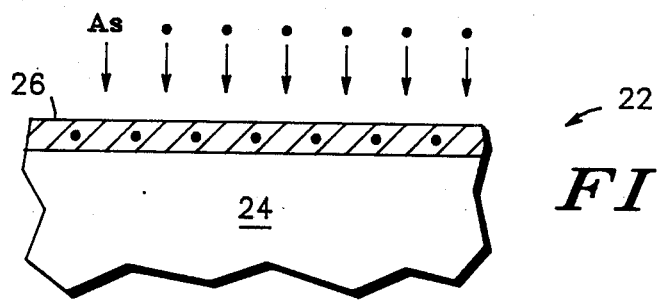
FIGS. 4A, 4B is a schematic cross-section illustration showing a implantation with a species other than argon, such as arsenic, and the results therefrom after multiple thermal cycles.
Figure 4B:
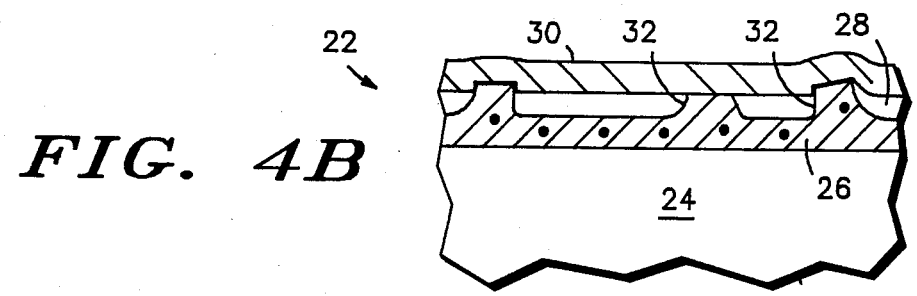

By way of contrast, FIG. 4 illustrates a cross-section of a second integrated circuit under construction 22, also shown only partially. Second semiconductor substrate 24, which may also have devices and other films or layers not shown, has formed thereon a metal layer 26 which is being implanted by an atom other than argon, in this case arsenic as represented by the dots in FIG. 4A, which the applicants discovered not to be effective in preventing hillock foraation for more than one thermal cycle. Again, as in a typical DLM process, FIG. 4B again shows second integrated circuit under construction 22 having had a dielectric layer 28 and a subsequent metal layer 30 formed thereon. However, when this structure is subjected to multiple thermal steps, hillock formation after the first subsequent thermal cycle is not suppressed, and large hillocks 32 are caused. While there may not be as many large hillocks 32 as small hillocks 20 in FIG. 3B, the presence of the few there are present a much greater danger for they can be tall enough to reach subsequent metal layer 30 to cause interlayer shorting.

In summary, it has been shown that Ar+ ion implantation is effective in suppressing hillocks in aluminum alloy films for multiple thermal anneal cycles. In a dose range between about 1 to $2 \times 10^{15}$ cm$^{-2}$, hillock growth is retarded without the deleterious effect of metal voiding. The thermal stability of the argon implanted film is critical to its integration into a DLM process which contains multiple thermal cycles after first metal deposition, as seen in FIGS. 3 and 4. The high susceptibility of arsenic implanted metal to form hillocks on subsequent thermal cycling makes it undesirable for such a process, contrary to the teachings of Y. Kamei, et al. The technique of the instant invention is expected to be useful in any integrated circuit in which metal topography needs to be planar. Also, the results of self-ion implantation has shown that the effect is not solely dependent on implant damage.

We claim:

1. In the manufacture of an integrated circuit on a semiconductor substrate, a process for suppressing the growth of hillocks in a metal film for multiple thermal cycles comprising the steps of:
    forming a metal film on the semiconductor substrate during the fabrication of an integrated circuit;
    distributing argon ions into the metal film; and
    processing the metal film through subsequent integrated circuit fabrication steps involving at least two thermal cycles.

2. The process of claim 1 in which the metal film is selected from the group consisting of aluminum and aluminum alloy.

3. The process of claim 1 in which the argon ions are distributed by ion implantation.

4. The process of claim 1 in which the metal film described therein is one of a plurality of metal films, and the subsequent integrated circuit fabrication steps involve forming a dielectric layer over the metal film and a subsequent metal film over the dielectric layer and in which subsequent fabrication steps require multiple thermal cycles.

5. The process of claim 3 in which the ion implantation dose of the argon is between 0.5 and $2 \times 10^{15}$ cm$^{-2}$.

6. The process of claim 5 in which the ion implantation dose of the argon is between 1 and $2 \times 10^{15}$ cm$^{-2}$.

7. In the manufacture of an integrated circuit on a semiconductor substrate, a process for suppressing the growth of hillocks in a metal film for multiple thermal cycle comprising the steps of:
    forming a metal film on the semiconductor substrate during the fabrication of an integrated circuit;
    implanting argon ions into the metal film at a dose in the range between about 0.5 and $5 \times 10^{15}$ cm$^{-2}$; and
    processing the metal film through subsequent integrated circuit fabrication steps involving at least two thermal cycles.

8. The process of claim 7 in which the metal film is selected from the group consisting of aluminum and aluminum alloy.

9. The process of claim 7 in which the ion implantation dose of the argon is between 1 and $2 \times 10^{15}$ cm$^{-2}$.

10. The process of claim 7 in which the metal film described therein is one of a plurality of metal films, and the subsequent integrated circuit fabrication steps involve forming a dielectric layer over the metal film and a subsequent metal film over the dielectric layer and in which subsequent fabrication steps require multiple thermal cycles.

* * * * *